US006178314B1

United States Patent
Whikehart et al.

(10) Patent No.: US 6,178,314 B1
(45) Date of Patent: Jan. 23, 2001

(54) RADIO RECEIVER WITH ADAPTIVE BANDWIDTH CONTROLS AT INTERMEDIATE FREQUENCY AND AUDIO FREQUENCY SECTIONS

(75) Inventors: J. William Whikehart, Novi; Nicholas Lawrence Difiore, Farmington Hills; John Elliott Whitecar, Plymouth, all of MI (US)

(73) Assignee: Visteon Global Technologies, Inc., Dearborn, MI (US)

(*) Notice: Under 35 U.S.C. 154(b), the term of this patent shall be extended for 0 days.

(21) Appl. No.: 08/883,646

(22) Filed: Jun. 27, 1997

(51) Int. Cl.[7] ....................................................... H04B 1/18
(52) U.S. Cl. ........................ 455/188.1; 455/266; 455/296
(58) Field of Search .................................... 455/266, 307, 455/302, 295, 306, 234.1, 316, 296

(56) References Cited

U.S. PATENT DOCUMENTS

| | | |
|---|---|---|
| 3,678,416 | 7/1972 | Burwen . |
| 3,753,159 | 8/1973 | Burwen . |
| 4,124,817 | 11/1978 | Takahashi . |
| 4,192,970 * | 3/1980 | Kahn ........................................ 381/15 |
| 4,352,208 * | 9/1982 | Schroeder ............................. 455/266 |
| 4,356,567 | 10/1982 | Eguchi et al. . |
| 4,688,255 * | 8/1987 | Kahn ........................................ 381/16 |
| 4,907,293 | 3/1990 | Ueno . |
| 5,095,534 * | 3/1992 | Hiyama ................................. 455/266 |
| 5,155,862 | 10/1992 | Hansen . |
| 5,220,687 | 6/1993 | Ichikawa et al. . |
| 5,230,098 * | 7/1993 | Seki .................................... 455/234.1 |
| 5,293,087 * | 3/1994 | Hamano et al. ....................... 327/558 |
| 5,303,413 * | 4/1994 | Braegas ................................. 455/266 |
| 5,307,515 * | 4/1994 | Kuo et al. ............................. 455/295 |
| 5,339,455 * | 8/1994 | Vogt et al. ............................. 455/266 |
| 5,396,657 * | 3/1995 | Jokinen ................................. 455/307 |
| 5,465,410 * | 11/1995 | Hiben et al. .......................... 455/266 |
| 5,491,725 | 2/1996 | White . |
| 5,493,717 * | 2/1996 | Schwarz ............................... 455/306 |
| 5,564,093 * | 10/1996 | Matsumoto ........................... 455/266 |
| 5,668,837 * | 9/1997 | Dent ...................................... 375/316 |
| 5,715,282 * | 2/1998 | Mansouri et al. .................... 375/350 |
| 5,745,856 * | 4/1998 | Dent ...................................... 455/552 |
| 5,987,304 * | 11/1999 | Latt ......................................... 455/17 |

OTHER PUBLICATIONS

EIA Interim Standard, Audio Bandwidth and Distortion Recommendations for Am Braodcast Receivers, Electronic Industries Association, Mar., 1991.

Entertainment and Information Merge in the Automobile, William C. Spelman, IEEE Vehicular Technology Society News, pp. 49–55, Feb., 1996.

* cited by examiner

Primary Examiner—Dwayne D. Bost
Assistant Examiner—Sonny Trinh
(74) Attorney, Agent, or Firm—Mark L. Mollon

(57) ABSTRACT

An adaptive bandwidth control system optimizes radio reception by controlling intermediate frequency bandwidth and baseband bandwidth to reduce both interference and noise while remaining compatible with AM broadcasts using the NRSC-1 standard. An adaptive IF filter detects the presence of interfering undesired sources. The IF bandwidth is narrowed if any interferers are detected. Simultaneously, the frequency content of the demodulated baseband signal is analyzed to control an optimal baseband bandwidth so that any frequencies containing substantially only noise are eliminated.

4 Claims, 6 Drawing Sheets

RADIO RECEIVER WITH ADAPTIVE BANDWIDTH CONTROLS AT INTERMEDIATE FREQUENCY AND AUDIO FREQUENCY SECTIONS

BACKGROUND OF THE INVENTION

The present invention relates in general to a radio receiver with improved reproduction quality in the presence of adjacent-channel interferers and/or noise sources, and more specifically, to separately-controlled adaptive filtering of the intermediate frequency signal and of the baseband (audio) signal.

In superheterodyne receivers, an RF signal from an antenna is processed through a series of mixing (frequency translation) and filtering operations. Due to all the various types of reception conditions that are possible (e.g., noise and interference), trade-offs have to be made in designing a filtering scheme so as to provide satisfactory reception under most conditions.

Commercial AM and FM broadcast bands include a plurality of evenly spaced channels. A particular broadcast station is allocated a unique channel to conduct broadcasting within an assigned frequency range.

The power spectrum of a broadcast transmission consists of the strength of RF signals irradiating a receiving antenna over a range of frequencies. Even though most energy in a transmission can be limited to its assigned channel, some energy is often radiated at frequencies outside their assigned channels. Adjacent and/or alternate channel interferers are often present. Radio receivers must be able to perform adequately in situations where a strong signal on an adjacent or alternate channel creates signal components in the desired channel which interfere with reception of the desired signal.

Prior art radio receivers are known which detect the presence of interference in various ways and which attempt to reduce effects of the interference by narrowing the receiver bandwidth (or by shifting the receiver passband for the desired channel). Separate filters or retuning of the receiver are typical methods for detecting presence of an interfering channel.

Other prior art receivers are known which provide dynamic noise reduction by adaptively filtering the baseband (i.e., demodulated) signal according to the frequency content of the baseband signal. The bandwidth at baseband is widened or narrowed as necessary to closely match the frequency content of the received signal. High frequencies at which low levels of energy are measured are assumed to contain only noise and are, therefore, filtered out.

Even though all channels in a broadcast service may be assigned equal bandwidth, not all transmitters utilize the available bandwidth to the same extent. For example, the standard NRSC-1 AM Preemphasis/Deemphasis and Broadcast Audio Transmission Bandwidth Specifications (ANSI-EIA-549-1988), which was published by the National Radio Systems Committee, provides for full utilization of AM channel bandwidth and for a specified preemphasis characteristic by the transmitter. A specially designed receiver (which may be certified as an AMAX receiver) can provide specified filtering and deemphasis characteristics of its own in order to take advantage of the potential reception improvements. However, such a receiver should not be limited to only those fixed characteristics since not all AM stations use all aspects of the standard in their broadcasts.

In view of all the different filtering criteria to reduce noise and interference and all the different broadcast characteristics that may be present in a desired signal, a filtering system is needed which is compatible with various types of broadcasts but which is effective in removing noise and interference in all cases.

SUMMARY OF THE INVENTION

The present invention has the advantage of providing a receiver with compatibility for AMAX-type broadcasts while minimizing effects of adjacent-channel interferers and noise sources.

In one aspect of the invention, a radio receiver receives broadcasts wherein individual broadcasts have different respective bandwidth usage with respect to a standard channel spacing. The radio receiver includes an intermediate frequency channel filter for filtering an intermediate frequency signal according to a bandwidth selectable between at least a wide bandwidth including substantially all of a broadcast channel or a narrow bandwidth including less than all of the broadcast channel. A first controller is coupled to the intermediate frequency channel filter for detecting the presence of interfering signals from an undesired source, the first controller selecting the wide bandwidth when interfering signals are not detected and selecting the narrow bandwidth when interfering signals are detected. A demodulator is coupled to the intermediate frequency channel filter for demodulating a filtered intermediate frequency signal to produce a baseband signal. A noise reduction filter is coupled to the demodulator for filtering the baseband signal. The noise reduction filter has a controllable upper cutoff frequency. A second controller is coupled to the noise reduction filter for controlling the upper cutoff frequency in response to a frequency content of the baseband signal.

DETAILED DESCRIPTION OF PREFERRED EMBODIMENTS

Figure 1:
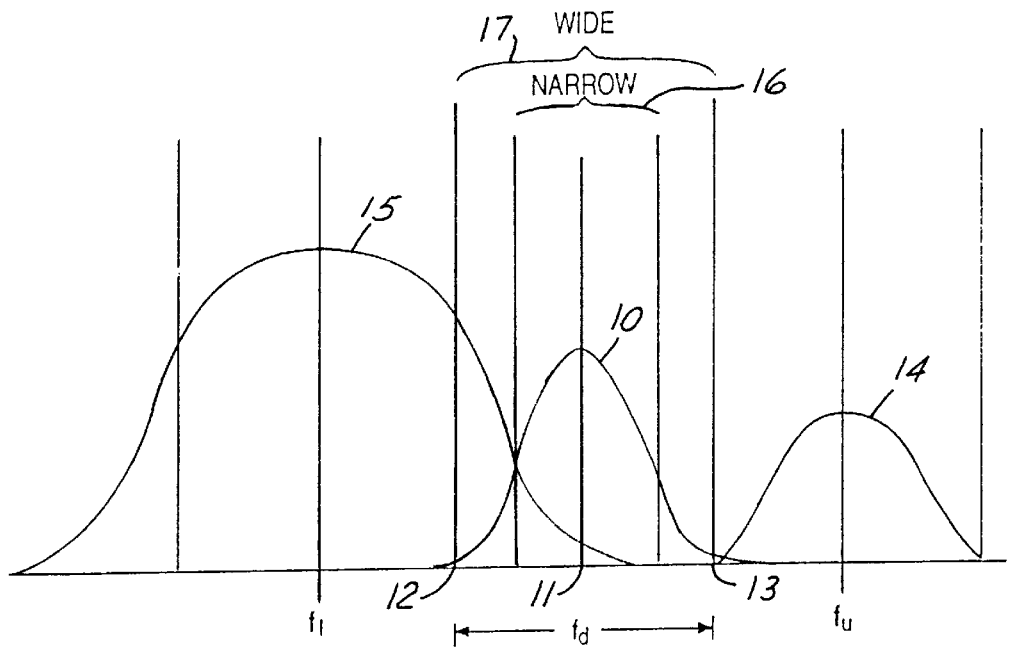
FIG. 1 plots reception field strength in a local reception area in which adjacent channel interference exists for a desired channel of interest.

FIG. 1 shows the frequency spectrum 10 of a desired radio broadcast having a center frequency 11 and occupying an assigned channel $f_d$ between a lower frequency 12 and an upper frequency 13. The upper adjacent channel $f_u$ is shown containing a broadcast signal 14 with substantially no excess signal content in the desired frequency channel, whereby the upper adjacent channel is not causing interference. However, the lower adjacent channel at $f_1$ is shown to include a radio broadcast having a frequency spectrum 15 including significant signal content above the lower frequency 12 of the desired channel. The resulting interference degrades reception of the desired radio broadcast.

Adjacent channel interference can be reduced by means of narrowing the passband of a bandwidth filter in the receiver to reduce the signal content from the adjacent channel propagating through the receiver. Thus, FIG. 1 shows a narrow bandwidth 16 which can be switched into the intermediate signal path to alleviate adjacent channel interference. When no adjacent channel interference is present, a wide bandwidth 17 is used in order to maximize quality of the received desired signal.

Figure 2:
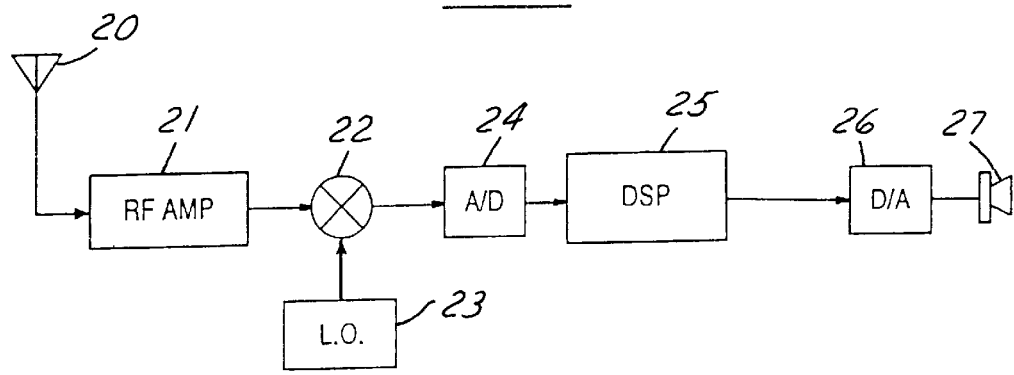
FIG. 2 is a block diagram showing portions of a DSP radio receiver.

FIG. 2 is a block diagram showing a radio receiver using digital signal processing. An antenna 20 receives broadcast RF signals which are coupled to an RF amplifier 21. Amplified RF signals are provided to one input of a mixer 22. A local oscillator 23 provides a mixing signal to a second input of mixer 22, the mixing signal having a frequency under control of a tuning control circuit (not shown). A carrier-based signal in the form of an intermediate frequency (IF) signal having a lower frequency than the original broadcast frequency is provided from mixer 22 to the input of an analog-to-digital (A/D) converter 24. A digitized IF signal is provided to digital signal processor (DSP) block 25 for filtering, demodulating, and other further processing of the resulting audio signal. A final audio signal is output from DSP 25 to the input of a digital-to-analog (D/A) converter 26 which provides analog audio signals to a speaker system 27.

DSP technology can be used to create a radio receiver having reduced cost and size, and having improved performance. In addition, new features and techniques can be easily added in DSP.

Figure 3:
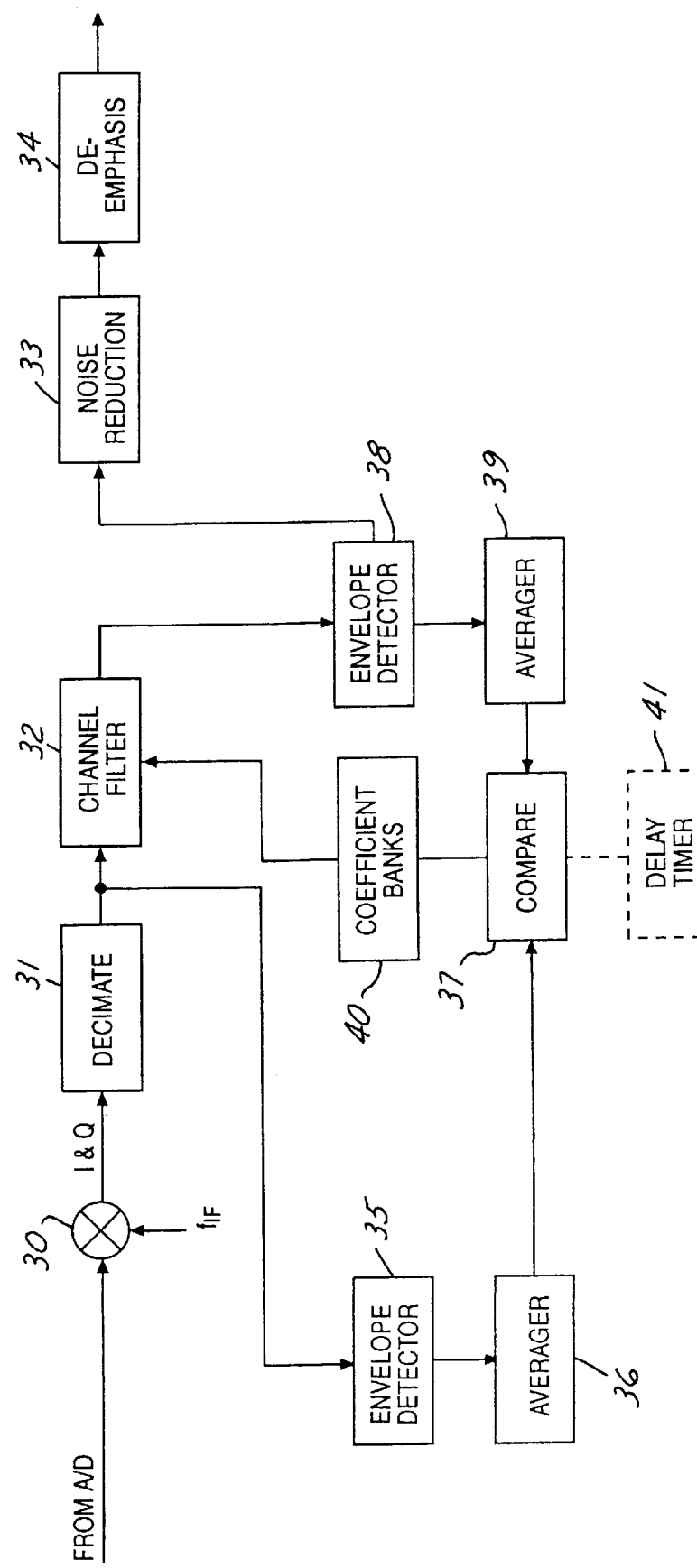
FIG. 3 is a block diagram showing DSP processing of an AM intermediate frequency signal.

Processing of the digitized IF signal in DSP block 25 is shown in greater detail in FIG. 3. This embodiment is particularly adapted for receiving AM signals. The digitized IF signal is provided to one input of a mixer 30 which receives a mixing signal $f_{IF}$ at a second input. Mixer 30 is preferably a complex mixer and produces in-phase (I) and quadrature-phase (Q) signals. The frequency of injection signal $f_{IF}$ is nominally equal to the intermediate frequency from the A/D converter, such that the IF signal is mixed to a new IF frequency of approximately zero Hertz. Other non-zero IF frequencies or non-complex signal representations can also be used in DSP with the present invention. However, a zero-IF complex representation has many advantages in DSP processing such as compact code size, minimized chip area, and efficient data manipulation.

The complex I and Q signals are provided to a decimate block 31 which provides sample-reduced signals to the input of a channel filter 32. Channel filter 32 rejects signals outside the frequency band of interest and the bandwidth-limited signals are provided to an envelope detector 38. Envelope detection can be obtained as the square root of the sum of the squares of I and Q. An envelope detected signal is provided to a noise reduction block 33 and a de-emphasis block 34. Noise reduction block 33 operates dynamically according to frequency content of a signal and the relative amount of noise detected. De-emphasis block 34 provides compatibility with AMAX broadcasts.

Channel filter 32 is preferably implemented as a filter processor within DSP and has a switchable bandwidth according to switched filter coefficient banks from block 40.

The remaining components shown in FIG. 3 detect the presence of adjacent channel interferers and control the channel filter bandwidth accordingly. The decimated complex signal from decimate block 31 is provided to the input of an envelope detector 35. The envelope signal is provided to the input of an averager 36 which generates a level detection signal. One input of a compare block 37 receives the pre-channel filter level detection signal.

The output of envelope detector 38 is coupled to an averager 39 to provide a post-channel filter level detection signal to another input of compare block 37.

Thus, a level detector upstream of channel filter 32 has its output compared to the output of a level detector downstream of channel filter 32. The difference in output level signals from the pre-filter level detector and the post-filter level detector is indicative of how much signal content from outside the desired channel is being filtered out by channel filter 32. The greater the signal content being filtered out, the greater the likelihood that there is an adjacent channel interferer. Thus, by comparing these two level signals in compare block 37, adjacent channel interference is detected and appropriate filter coefficient banks are selected from block 40 for loading in channel filter 32 to provide either narrowband or wideband filtering.

Compare block 37 utilizes a predetermined threshold for comparison with the difference between the level signals in order to determine whether sufficient adjacent channel energy is present to necessitate switching to the narrow bandwidth. Once a narrow bandwidth is selected, the difference in level signals can be expected to increase and a different threshold is then utilized in compare block 37. Furthermore, the thresholds employ hysteresis to avoid rapid switching back and forth of the bandwidth. Alternatively, a delay timer 41 is connected to compare block 37, so that the comparison is only performed periodically and so that bandwidth switching can only occur at predetermined intervals.

Figure 4:
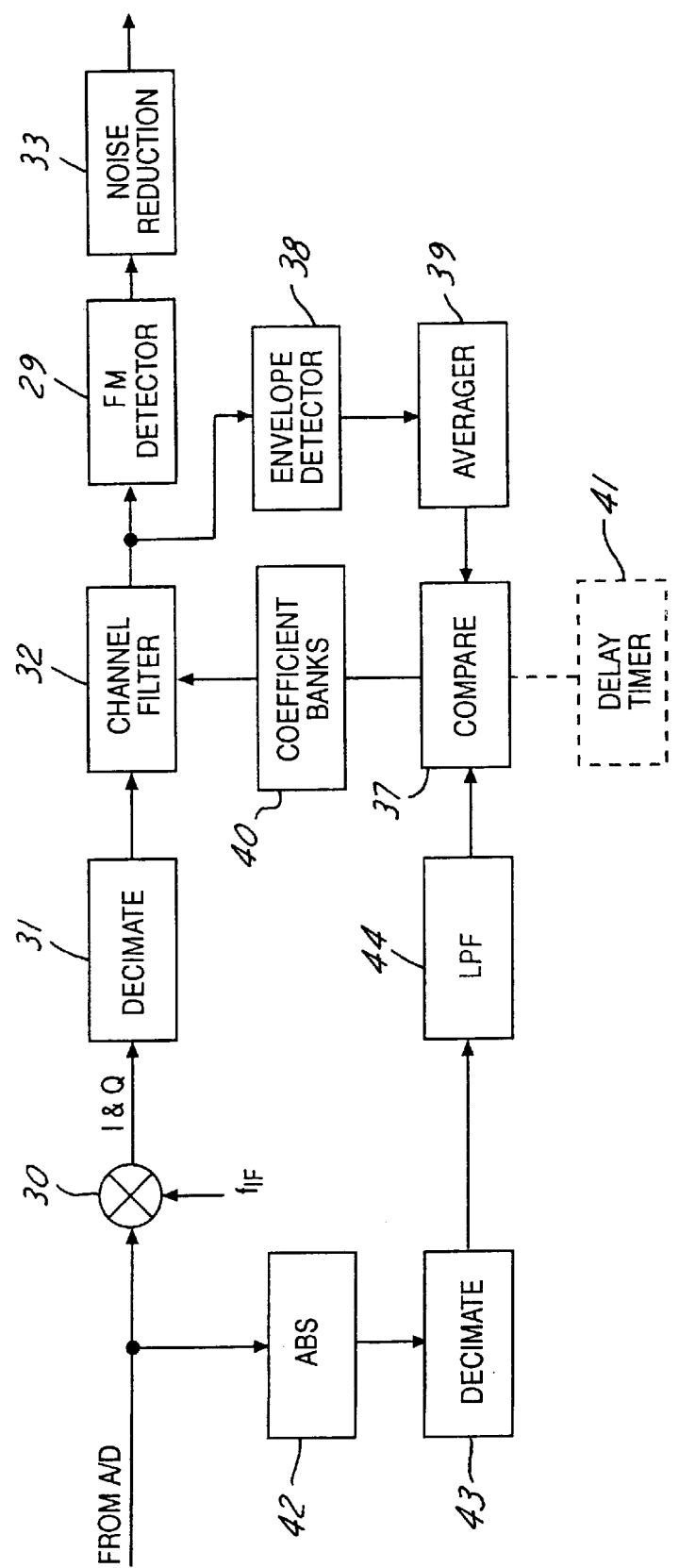
FIG. 4 is a block diagram showing DSP processing of an FM intermediate frequency signal.

FIG. 4 shows an alternative embodiment for processing an FM-modulated IF frequency. The digitized IF (prior to complex mixing in mixer 30) is full-wave rectified in an absolute value block 42. An absolute value signal has its sample rate reduced in decimate block 43 which provides the same reduction in sample rate as decimate block 31. The sample-rate reduced absolute value signal is lowpass filtered in LPF 44 to produce the pre-filtered level detection signal. Post-filter level detection is similar to FIG. 3. An FM detector 29 is connected between channel filter 32 and noise reduction block 33.

Figure 5:
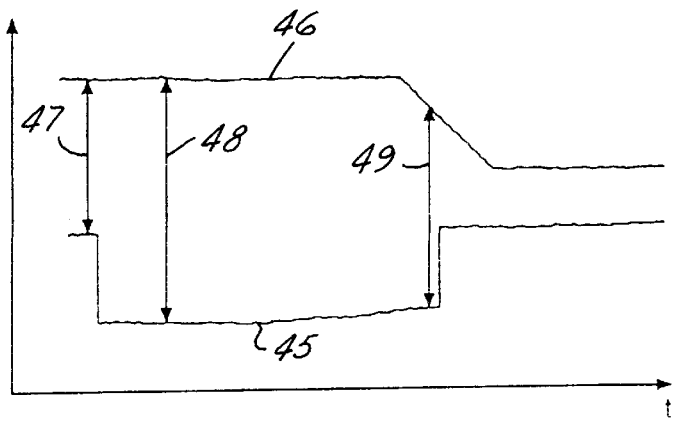
FIG. 5 plots detected level signals from pre-filter and post-filter level detectors during mobile reception.

FIG. 5 shows the magnitude of a first level signal 45 from the post-filter level detector and a second level signal 46 from the pre-filter level detector. It is the difference between these two signals that is compared with a threshold to determine which bank of filter coefficients is loaded into the filter processor in order to obtain either the narrow or wide bandwidth of the filter. Upon initially tuning to a desired channel, a difference 47 is found between the first and second level signals. This difference is determined with the filter processor being switched to its wide bandwidth (corresponding with receiving the full channel). Difference 47 is greater than a first difference threshold so that the bank of filter coefficients is switched to provide the narrower bandwidth for the channel filter. After switching, a difference 48 exists between the first and second level signals. In this example, the strength of the interfering adjacent channel signal gradually diminishes over time (e.g., as a mobile radio drives away from the corresponding transmitter).

Eventually, a difference 49 is reached which is less than a second threshold used when the filter processor is at its narrower bandwidth, resulting in the switching back to the first bank of filter coefficients to provide a wider bandwidth.

Figure 6:
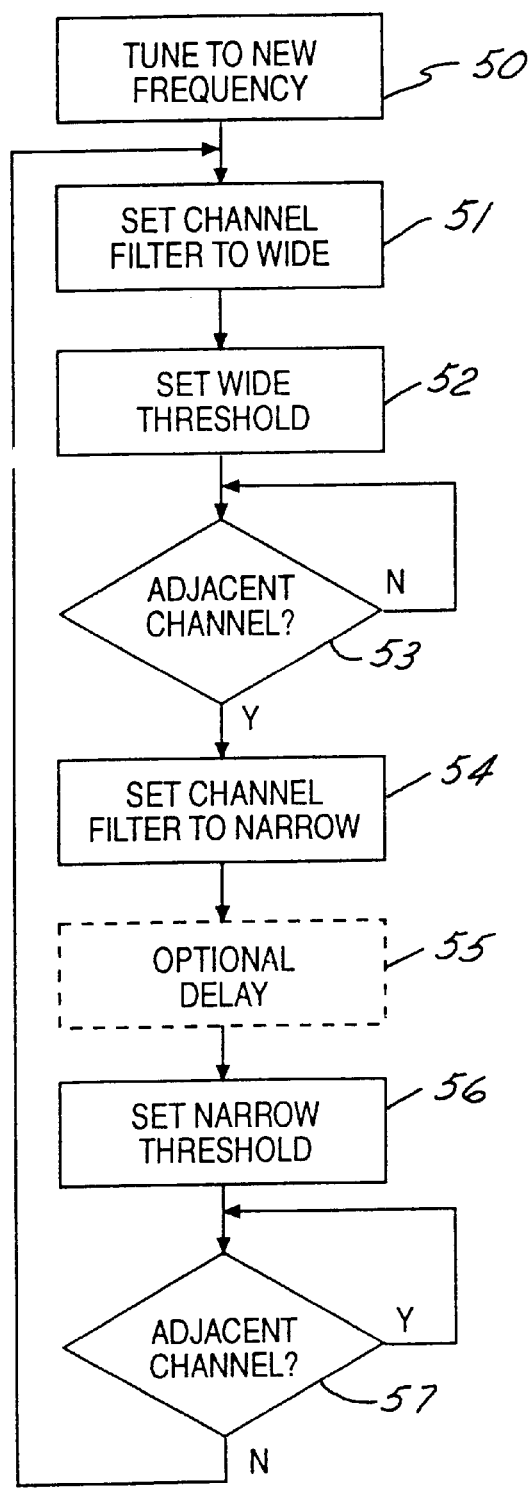
FIG. 6 is a flow-chart showing a preferred method of controlling an IF channel filter.

A preferred method for adaptive channel filtering is shown in greater detail in FIG. 6. In step 50, the radio receiver is tuned to a new frequency. In step 51, the filter coefficient bank is selected which sets the channel filter processor to a wide bandwidth. The difference threshold is set to a value corresponding to the use of the wide bandwidth filter in step 52. In step 53, a check is made for an adjacent channel interferer by comparing the difference between the first and second signal levels with the wide threshold. If the difference is not greater than the difference threshold, then no significant interferer is currently present. No action is taken but step 53 continues to monitor for changes in the comparison.

If the difference is greater than the difference threshold, then an interferer is present and the bank of filter coefficients is selected in step 54 which gives the channel filter its narrower bandwidth. To avoid erratic switching of the channel filter bandwidth, an optional delay of several seconds can be executed in step 55. Alternatively, erratic switching can be avoided by using hysteresis in the different thresholds selected (i.e., an guardband is added to further separate the two thresholds).

In step 56, the difference threshold is set to a value corresponding to use of the narrow bandwidth channel filter. In step 57, a check is made to detect adjacent channel interferers by comparing the difference with the narrowband threshold. If the difference is greater than the narrowband difference threshold, then an interferer is still present. No change is made and step 57 continues to check using the narrow filter bandwidth and narrow threshold. If the difference becomes less than the narrow threshold, then the adjacent channel interferer is no longer present and a return is made to step 51 for switching the channel filter back to its wide bandwidth.

Depending upon the typical likelihood of interferers being present, general reception conditions, and the desired performance of a receiver, FIG. 6 could be easily modified to start out using a narrow bandwidth and then switching to a wide bandwidth only if interferers are not present.

Figure 7:
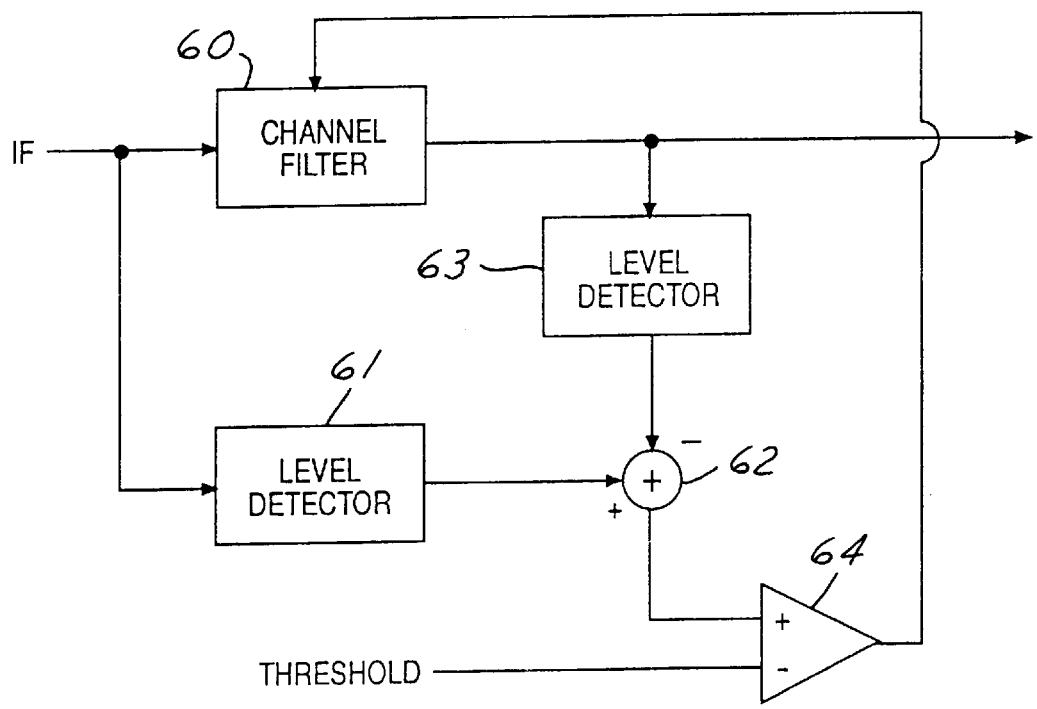
FIG. 7 is a block diagram showing an alternative representation of adaptive channel filter control.

An alternative block diagram of adaptive channel filtering is shown in FIG. 7. Channel filter 60 uses a narrow or wide passband to filter the IF signal. A pre-filter level detector 61 generates a level signal in response to the pre-filtered IF signal and provides a level signal to one input of a summer 62. A post-filter level detector 63 generates a level signal responsive to the filtered IF signal and provides the level signal to another input of summer 62. One input of summer 62 is inverted so that the output of summer 62 provides a difference signal equal to the difference between the two level signals. The difference signal is applied to the non-inverting input of a comparator 64. A threshold signal is provided to the inverting input of comparator 64 and the comparator output is connected to an input of channel filter 60 for selecting the filter bandwidth. The magnitude of the threshold signal is set as described above.

Figure 8:
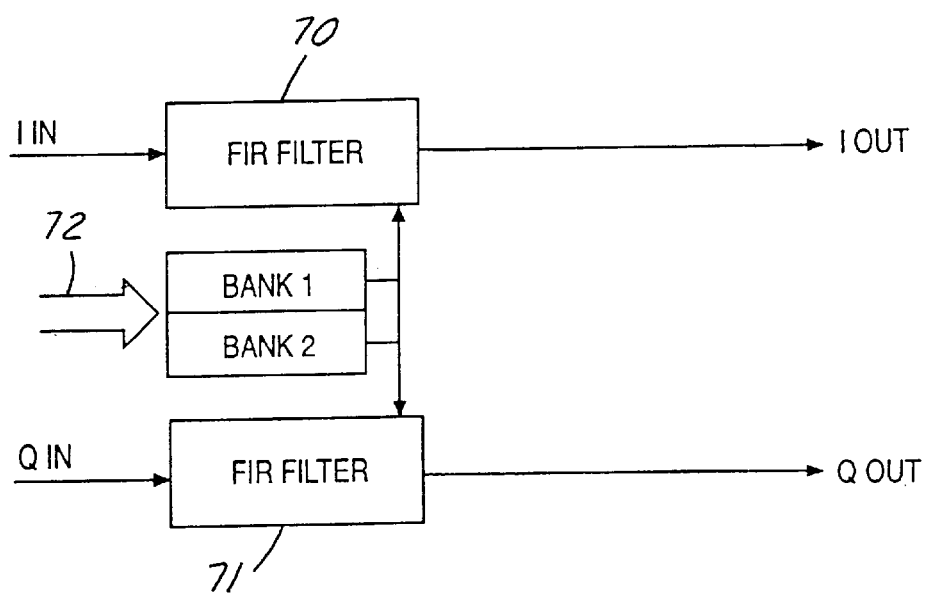
FIG. 8 is a block diagram showing a filter processor for implementing a channel filter as used in the present invention.

FIG. 8 shows a channel filter in more detail. A finite impulse response (FIR) filter or an infinite impulse response (IIR) filter can be implemented using a DSP filter processor. In particular, applicants have used an FIR filter for FM processing and an IIR filter for AM processing. In the preferred embodiments, a complex (i.e. in-phase and quadrature-phase component) signal is used to represent the IF signal. Channel filtering for the I component and the Q component is provided by separate filter elements 70 and 71, respectively. For example, each FIR filter in FIG. 8 is comprised of a multi-tapped delay line and is configured according to filter coefficients stored in coefficient banks 1 and 2. Control signals 72 are provided to the filter coefficient banks in order to selectively load either bank 1 or bank 2 into FIR filters 70 and 71. FIR filtering has the advantage that the output of the filter has greater continuity before and after changing the filter bandwidth than does an IIR filter, and so transient effects are minimized. As another means to reduce transients, it may be desirable to set all signal values in the filter to zero at the time that the filter coefficients are switched. Alternatively, the receiver output can be briefly muted at the time of switching.

In other alternative embodiments, the adaptive channel filtering could utilize more than two discrete bandwidths. A range of bandwidths can be obtained using a plurality of filter coefficient banks and a like plurality of difference thresholds.

Coordinated operation of the IF channel filter and the baseband noise reduction filter will be described with reference to FIGS. 9 and 10. The present invention operates in a manner which always limits interfering signals while remaining compatible with all types of in-band signals. Furthermore, when no adjacent-channel interferers are present and the IF channel filter is consequently at its wide bandwidth, filtering of in-band noise is still achieved by virtue of the noise reduction filter.

Figure 9:
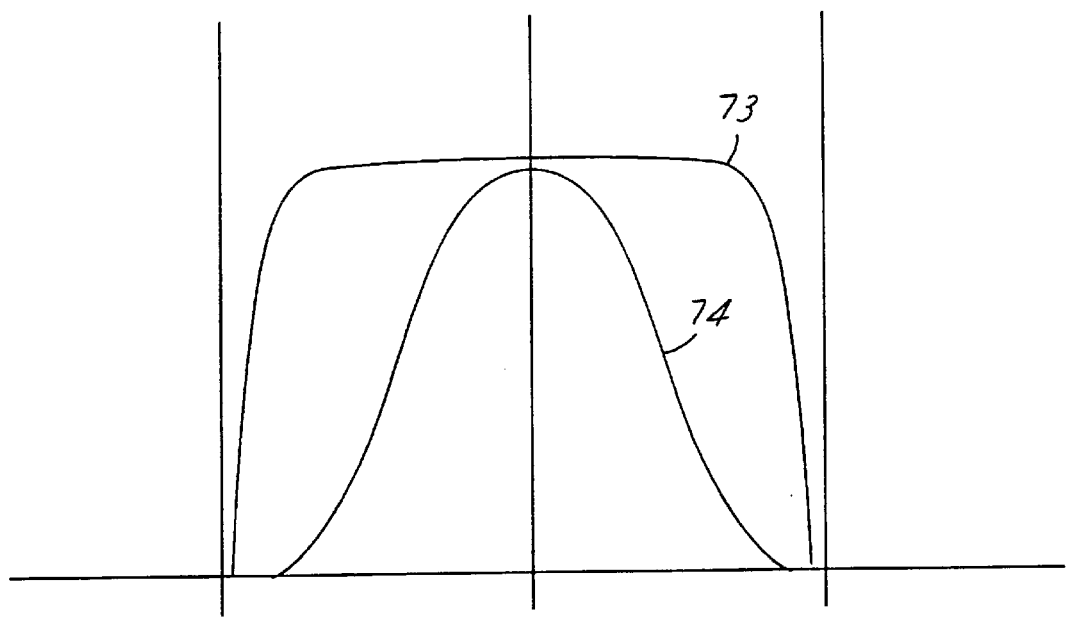
FIG. 9 plots bandwidth usage for various broadcast signals.

FIG. 9 shows a broadcast spectrum 73 that may be produced by a transmission in conformance with the NRSC-1 standard. It demonstrates near full utilization of the available channel. Broadcast spectrum 74 corresponds to a station not transmitting according to the NRSC-1 standard and which happens to have an IF bandwidth not exactly corresponding with the full assigned channel. An objective of the invention is to provide optimal desired signal selectivity for either type of broadcast with or without interferers present.

Figure 10:
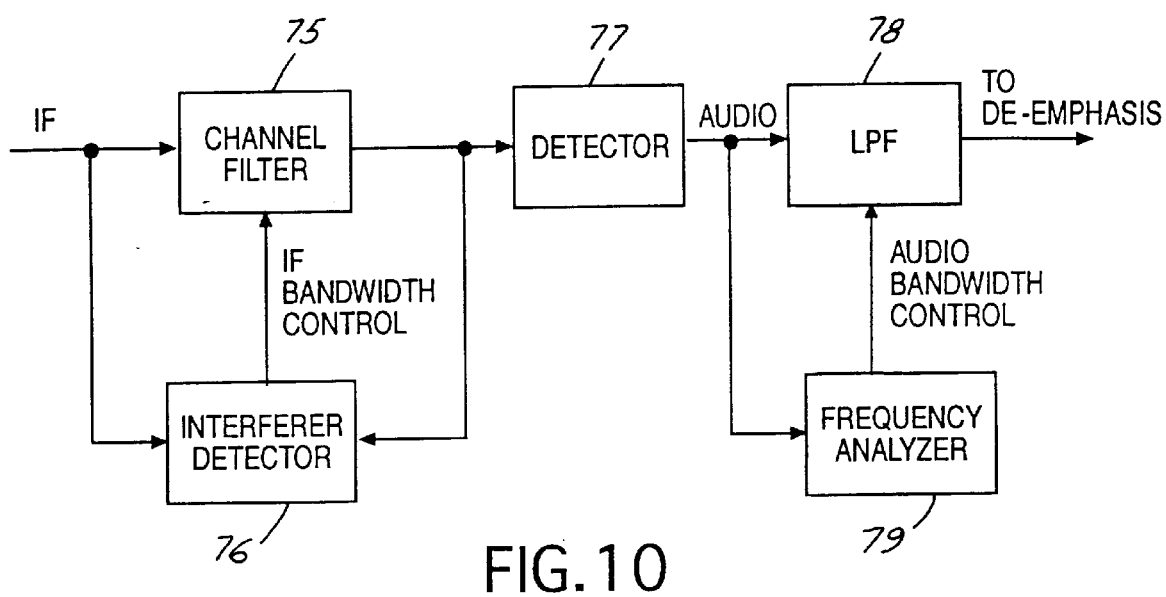
FIG. 10 is a block diagram showing the dual, independently controlled adaptive filters of the present invention.

As shown in FIG. 10, the IF signal is passed through channel filter 75. An interferer detector 76 (which may be comprised of pre- and post-filter level detectors as described above) generates an IF bandwidth control signal for selecting a wide or narrow channel filtering as determined by the presence or absence of an interferer. The channel-limited IF signal is demodulated in detector 77 to produce a baseband signal which is typically an audio signal.

The baseband signal is lowpass filtered in noise reduction LPF 78. The baseband signal is coupled to a frequency analyzer 79 which detects the frequency content of the baseband signal and controls LPF 78. The upper cutoff frequency of LPF 78 is set such that higher audio frequencies are filtered out that do not have a significant amount of energy present in them. This increases the signal-to-noise ratio in the receiver. The upper cutoff frequency is set by an audio bandwidth control signal from frequency analyzer 79. The noise-reduced baseband signal is coupled to a de-emphasis block to attenuate higher frequency content that would have been boosted during pre-emphasis if the transmission conformed with NRSC-1. If, on the other hand, the transmission did not conform with NRSC-1 pre-emphasis, then such higher frequency content will often not be present to begin with. Thus, de-emphasis will not cause a loss of any desired signal for many non-NRSC-1 broadcasts. In fact, it may in those circumstances improve signal-to-noise ratio even further.

Although channel filter 75 and noise reduction LPF 78 are independently controlled, they cooperate to give optimal performance under a variety of reception conditions. Whenever undesired interferers are present, the IF bandwidth is reduced whether or not the desired broadcast complies with NRSC-1. If there are no undesired interferers detected, then the full IF bandwidth is used. If a non-NRSC-1 broadcast is being received with no interferers detected, then the IF bandwidth can possibly be passing frequencies which do not contain any final baseband content. If other types of in-band noise are present then their effects are mitigated by appropriately limiting the baseband cutoff frequency in noise reduction LPF 78. Thus, the two bandwidths will automatically acquire sizes which optimize radio reception quality.

What is claimed is:

1. A radio receiver for receiving broadcasts wherein individual broadcasts have different respective bandwidth usage with respect to a standard channel spacing, said radio receiver comprising:

an intermediate frequency channel filter for filtering an intermediate frequency signal according to a bandwidth selectable between at least a wide bandwidth including substantially all of a broadcast channel or a narrow bandwidth including less than all of said broadcast channel;

a first controller coupled to said intermediate frequency channel filter for detecting the presence of interfering signals from an undesired source, said first controller selecting said wide bandwidth when interfering signals are not detected and selecting said narrow bandwidth when interfering signals are detected;

a demodulator coupled to said intermediate frequency channel filter for demodulating a filtered intermediate frequency signal to produce a baseband signal;

a noise reduction lowpass filter coupled to said demodulator for filtering said baseband signal, said noise reduction filter having a controllable upper cutoff frequency; and a second controller coupled to said noise reduction filter for controlling said upper cutoff frequency in response to a frequency content of said baseband signal.

2. The radio receiver of claim 1 wherein said upper cutoff frequency is set to a lowest frequency that still allows a predetermined fraction of said baseband signal to pass through said noise reduction filter.

3. The radio receiver of claim 1 wherein some of said individual broadcasts are transmitted with pre-emphasis, and wherein said radio receiver further includes a de-emphasizer coupled to an output of said noise reduction filter for providing de-emphasis to said baseband signal whether or not a particular broadcast was transmitted with pre-emphasis.

4. The radio receiver of claim 1 wherein said baseband signal is comprised of an audio signal.

* * * * *